United States Patent [19]

Schaber et al.

[11] Patent Number: 4,737,472
[45] Date of Patent: Apr. 12, 1988

[54] PROCESS FOR THE SIMULTANEOUS PRODUCTION OF SELF-ALIGNED BIPOLAR TRANSISTORS AND COMPLEMENTARY MOS TRANSISTORS ON A COMMON SILICON SUBSTRATE

[75] Inventors: Hans-Christian Schaber; Armin Wieder, both of Graefelfing; Johannes Bieger, Munich, all of Fed. Rep. of Germany

[73] Assignee: Siemens Aktiengesellschaft, Berlin and Munich, Fed. Rep. of Germany

[21] Appl. No.: 931,640

[22] Filed: Nov. 17, 1986

[30] Foreign Application Priority Data

Dec. 17, 1985 [DE] Fed. Rep. of Germany ....... 3544621

[51] Int. Cl.[4] .................... H01L 27/00; H01L 21/28; H01L 21/302
[52] U.S. Cl. ........................ 437/59; 437/31; 437/33; 437/233; 437/191; 437/195; 148/DIG. 9; 148/DIG. 124; 357/43; 357/59; 357/34; 156/653
[58] Field of Search ................ 29/591, 578, 576 C, 29/580, 577 C; 148/188, DIG. 9, DIG. 124; 357/43, 59 H, 34; 156/653, 657; 437/31, 32, 33, 186, 196, 195, 233, 54, 59

[56] References Cited

U.S. PATENT DOCUMENTS 4,290,186 9/1981 Klein et al. ........................ 29/977 C

OTHER PUBLICATIONS

Motorola "The Epic Process" *Motorola Monitor* vol. 2, #2 Jun. 64.

*Primary Examiner*—Brian E. Hearn
*Assistant Examiner*—Kevin McAndrews
*Attorney, Agent, or Firm*—Hill, Van Santen, Steadman & Simpson

[57] ABSTRACT

A process for the simultaneous production of self-aligned bipolar transistors and complementary MOS transistors on a common silicon substrate wherein n-doped zones are produced in the p-doped substrate and insulated npn-bipolar transistors are formed into the n-doped zones. The n-zones form the collectors of the transistors and are modified according to conventional technology by additional process steps such that bipolar transistors are formed which are self-aligning both between the emitter and the base and also between the base and collector with extremely low-ohmic base terminals consisting of polysilicon and a silicide. Storage capacitances can also additionally be integrated into the structure. The use of the base terminals thus produced permits very small lateral emitter-collector distances. The combination of dynamic CMOS memory cells with fast bipolar transistors is made possible by the integration of the storage capacitances. The process is used for the production of VLSI circuits of high switching speeds.

15 Claims, 4 Drawing Sheets

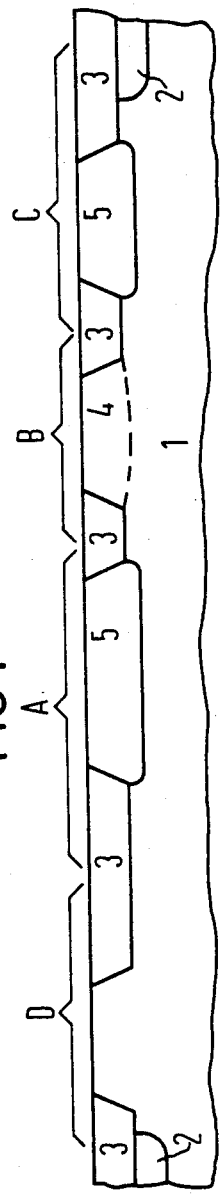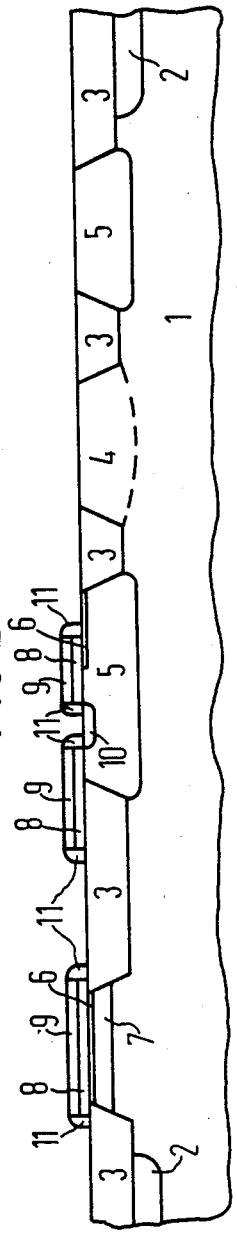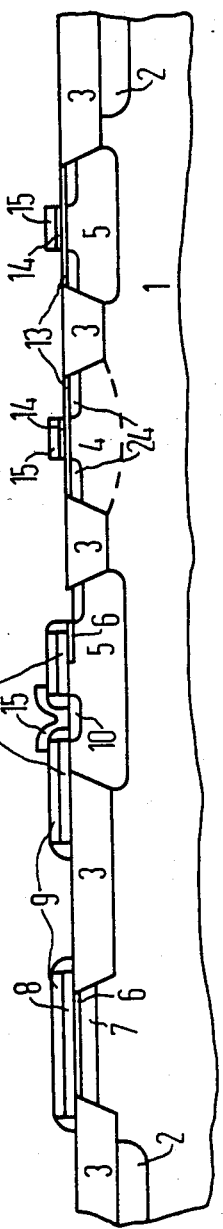

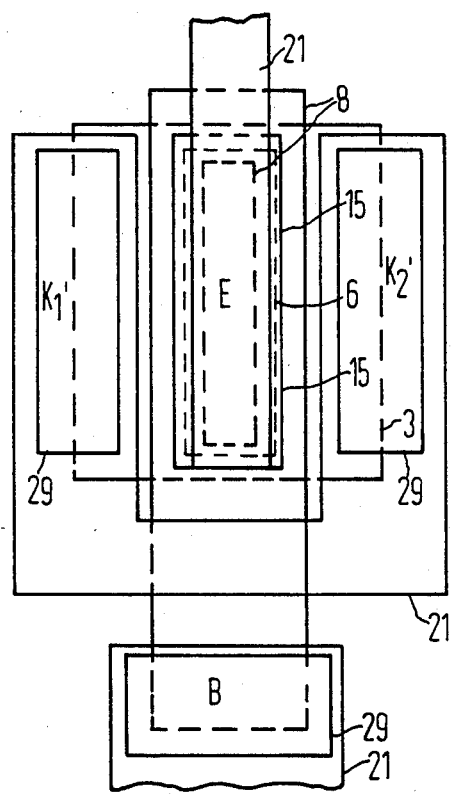

PROCESS FOR THE SIMULTANEOUS PRODUCTION OF SELF-ALIGNED BIPOLAR TRANSISTORS AND COMPLEMENTARY MOS TRANSISTORS ON A COMMON SILICON SUBSTRATE

BACKGROUND OF THE INVENTION

1. Field of the Invention

The present invention relates to a process for the simultaneous production of self-aligned bipolar transistors and complementary CMOS transistors on a common silicon substrate wherein n-doped zones are produced in the p-doped substrate and insulated npn-bipolar transistors are formed into the n-doped zones, the n-zones forming the collectors of the transistors.

2. Description of the Prior Art

In highly integrated circuits, the integration of CMOS and bipolar transistors on a common substrate is highly advantageous with regard to system speed because gate delay time losses on lines or other capacitively loaded elements such as outputs can be greatly reduced by bipolar driving transistors. However, this is only possible when the intrinsic switching time of the bipolar transistors is comparable with that of the CMOS transistors and that the yield of the total process is not degraded to a large extent by the additional process steps which are required for the production of the bipolar transistors.

In order to reduce the collector resistance, known processes for the integration of bipolar and CMOS transistors use a buried collector with subsequent epitaxy. A process of this type is, for example, disclosed in the paper by H. Higuchi et al entitled "Performance and structures of scaled down bipolar devices merged with CMOSFETS" in the IEDM Technical Digest (1984), pages 694 to 697. However, these process steps frequently result in relatively high densities of imperfections of the crystal and therefore restrict the yield and thus the degree of integration of the circuit.

On the other hand, if the buried collector is omitted as disclosed by a paper by F. Walczyk and J. Rubinstein entitled "A merged CMOS/BIPOLAR VLSI-Process" appearing in IEDM, Vol. 83, Technical Digest (1983), pages 59 to 62, bipolar transistors with inefficient intrinsic switching times and lowered current efficiencies are obtained through the use of conventional manufacturing steps such as using arsenic-implanted emitters which are aligned relative to the base contact zone.

A considerable improvement is achieved in this respect by means of coupling bipolar CMOS processes with self-aligned bipolar transistors as described, for example, in a paper by A. R. Alvarez appearing in IEDM, Vol. 84, Technical Digest (1984), pages 761 to 764. Previously known processes of this type still produce relatively high base resistances and large lateral distances between the emitter and collector, as a result of which the switching velocities and current efficiencies of the bipolar transistors which are obtained are likewise limited.

SUMMARY OF THE INVENTION

The present invention seeks to provide a process by means of which a combination of self-aligned bipolar transistors with extremely low-ohmic base terminals consisting of polycrystalline silicon and/or a silicide is made possible. In particular, a self-alignment between the base and collector and thus negligible lateral distance between emitter and collector are rendered feasible. In addition, the integration of storage capacitances is achieved without great additional expense.

The overall process of the type described above can be set forth in the following sequence of process steps:

(a) applying a double layer consisting of silicon oxide and silicon nitride onto a p-doped substrate and structuring the silicon nitride layer for the subsequent local oxidation (LOCOS);

(b) producing a field oxide which is required for the separation of the active transistor regions in the substrate by local oxidation, using the silicon nitride structure as an oxidation mask;

(c) producing the n-zones and p-zones in the substrate by implantation of n- and p-doped ions, coupled with diffusion;

(d) removing the nitride/oxide mask;

(e) producing a first insulator layer along the entire surface at a thickness of at most 50 nm to serve as a protective layer of the later applied gate zones during etching and as a dielectric for the manufacture of the storage capacitor, this insulator layer avoiding the diffusion of boron from the p-conductive layer which is applied at a later time, in sub-zones of the bipolar transistors which are adjacent to the later formed collector zone;

(f) removing the first insulating layer in all the sub-zones of the later formed bipolar transistors except for the collector region and the regions which are adjacent thereto, by means of photolithography;

(g) removing the photo-resist mask;

(h) doping the electrode of the storage capacitors, using a photo-resist technique;

(i) depositing a p-conducting layer consisting of polysilicon, a refractory metal silicide or a double layer of polysilicon and metal silicide over the entire surface area;

(j) depositing a second insulating layer over the entire area;

(k) using a photo-resist technique to structure the two layers having vertical sidewalls until the substrate is exposed by means of a dry etching process for defining the base zones of the bipolar transistors and of the storage capacitor region;

(l) implanting a channel zone for the adjustment of the threshold voltage of the MOS transistors;

(m) implanting boron ions for the production of the active base zone by a photo-resist technique;

(n) applying a third insulating layer over the full area which efficiently covers the edges of the structures of the p-conducting layer and the second insulating layer;

(o) anisotropically etching to produce lateral insulation strips from the third insulating layer on the sidewalls of the p-conducting layer structure and to expose the silicon substrate in the active regions of the MOS transistors and in the emitter and collector zones of the bipolar transistors;

(p) applying a fourth insulating layer which serves as a gate dielectric for the MOS transistors;

(q) depositing a first undoped polysilicon layer over the entire surface area;

(r) structuring the first polysilicon layer and the fourth insulating layer in such a manner that the substrate is exposed in the emitter and collector zones of the bipolar transistors through the use of a photo-resist technique;

(s) removing the photo-resist mask;
(t) depositing a second polysilicon layer;
(u) using a photo-resist technique to structure the first and second polysilicon layers in such a way that the gate electrodes of the MOS transistors and the emitter contacts of the bipolar transistors are formed;
(v) implanting phosphorus ions for the production of the source/drain connection zones of the n-channel MOS transistors and removing the photo-resist mask;
(w) implanting arsenic ions for producing the source/drain zones of the n-channel transistors and for doping the emitter and collector zones of the bipolar transistors;
(x) implanting boron ions for the production of the source/drain zones of the p-channel transistors;
(y) producing an intermediate layer which consists of an insulating oxide and applying a high temperature treatment on the order of 900° C. for diffusing arsenic into the source/drain zones of the n-channel transistors and into the emitter and collector zones, and for diffusing boron into the source/drain zones of the p-channel transistors and into the base contact zones;
(z) opening the contact apertures to the p+- and n$^{30}$-conducting terminals of the active transistor regions and applying metallic electrodes thereto.

The advantages of the process of the present invention are as follows:
1. Extremely low base resistances are obtained.
2. Although the buried collector is omitted, relatively small collector resistances are obtained.
3. High transit frequencies, greater than 4 GHz can be obtained for the bipolar transistors.
4. High yields can be achieved by avoiding epitaxy.
5. The process is fully compatible with known CMOS processes, i.e., the production of the bipolar transistors requires only additional process steps which do not change the properties of the MOS transistors from the known CMOS processes.
6. The process allows the integration of storage capacitances without any extra outlay, so that the combination of dynamic CMOS memory cells with fast bipolar transistors is possible.
7. By using the polysilicon/silicide base terminal in accordance with an embodiment to be described later, a very compact layout is feasible and thus very small lateral emitter-collector distances are obtained which can be further decreased by self-alignment between the base terminal region and the collector zone.
8. In one form of the present invention, two collector zones can be formed on both sides of the strip-shaped emitters at a minimal distance.

BRIEF DESCRIPTION OF THE DRAWINGS

FIGS. 1 to 4 illustrate sectional views of a process sequence as described in the present invention, the sequence being largely similar to known CMOS process sequences and described in detail. Only the processss steps which are relevant to the invention are illustrated.

FIGS. 8 to 10 illustrate layouts of the bipolar transistors in CMOS circuits, which transistors can be produced by the process in accordance with the present invention, FIG. 8 illustrating a transistor according to FIGS. 1 to 7 with only one collector zone, FIG. 9 illustrating a transistor with a U-shaped collector zone and FIG. 10 illustrating a bipolar transistor with two collector terminal regions.

DESCRIPTION OF THE PREFERRED EMBODIMENTS

Figure 4:
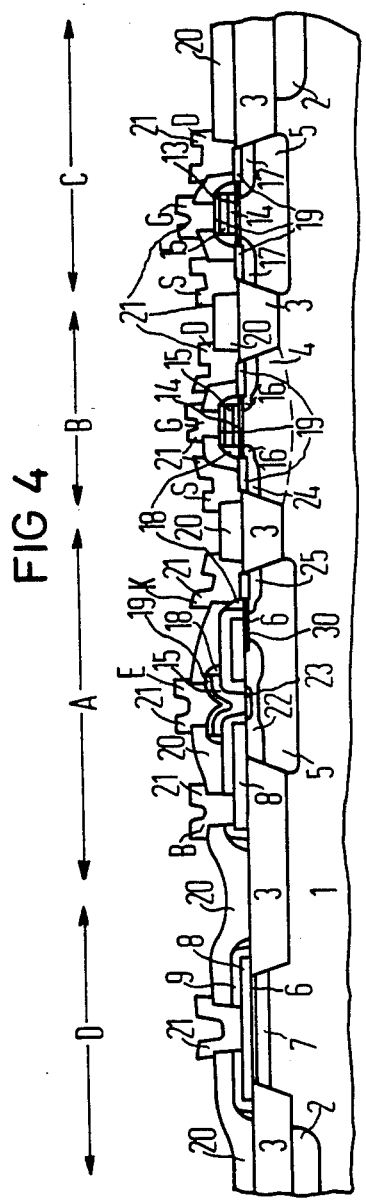

The structure of FIG. 1 is produced by the following sequence of steps.

First a double layer, consisting of silicon oxide and silicon nitride are applied onto a p-doped silicon substrate 1 and the silicon nitride layer is structured for the subsequent LOCOS step. The p-channel stopper regions 2 are produced by a boron deep implantation to provide a reliable insulation between the adjacent collector zones since the operating voltage of the parasitic thick oxide transistor is increased to values above the maximum operating voltage. Next, there is the production of a field oxide 3 which is required for the separation of the active transistor regions A, B, C and the MOS capacitance D in substrate 1 illustrated in FIG. 1. The field oxide is produced by local oxidation employing the silicon nitride structure referred to previously as an oxidation mask.

Then, n-region wells 5 and p-zones 4 are produced by a masked phosphorus ion implantation at a dosage of $2 \times 10^{12}$ cm$^{-2}$ and an energy level of 180 keV and by a masked boron implantation having a dose of $6 \times 10^{11}$ cm$^{-2}$ and an energy level of 60 keV. This is followed by removal of the nitride/oxide mask.

In FIG. 2 there is shown an SiO$_2$ layer 6 comprising the first insulating layer, and having a thickness of less than 50 nm. The layer 6 is applied to the entire area of the surface of the substrate 1, comprising the p- and n-doped zones 2, 4 and 5 and the field oxide zones 3 as a protective layer for the later formed gate zones and as a masking layer during the later boron diffusion from the p-conducting layer and further as a dielectric for the storage capacitance D. This layer is structured by means of a photo-resist technique in such a manner that the regions of the bipolar transistor A adjacent to the emitter are reexposed. Following the removal of the photo-resist mask, a deep phosphorus implantation into the collector zone is carried out in order to reduce the collector resistance. The electrodes 7 of the storage capacitors which are positioned in the substrate 1 are doped by a masked implantation of phosphorus or arsenic. When the photo-resist mask has been removed, the first conductive layer 8, which may consist of polysilicon, polysilicide or a metal silicide, is applied and p-doped either during the deposition or by subsequent implantation. A second insulating layer 9 consisting of SiO$_2$ is subsequently applied and structured together with the previously applied conductive layer 8 such that their structures serve as a boron diffusion source during the production of the base connection zone of the bipolar transistor A and as a terminal electrode in the storage capacitor D. Structuring of the double layer 8, 9 is carried out by means of dry etching procedures, for example, etching of the SiO₂ layer 9 by reactive ion etching in a trifluoromethane/oxygen gas mixture and the etching of the polysilicon layer 8 subsequently in a carbon tetrachloride/helium plasma. Vertical sidewalls are obtained in the etching processes. The substrate 1 should be etched as little as possible, less than 50 nm. Following the structuring, the channel implantation for the adjustment of the MOS operating voltage is carried out and an active base zone 10 is produced by implantation of boron ions using a photo-resist mask. An SiO₂ layer constituting the third insulating layer which efficiently covers the edges is finally applied over the entire area and structured by an anisotropic etching, for example, by reactive ion etching with a trifluoromethane/oxygen gas mixture in such a manner that only lateral insulating strips 11 remain on the sidewalls of the p-conducting layer structure 8, 9. In this etching process, the substrate surface 1 having the active zones of the MOS transistors B, C and the collector zone of the bipolar transistors A are etched free.

FIG. 3 illustrates the structure after the application of a fourth insulating layer 13 measuring about 5 to 50 nm and serving as a gate dielectric (gate oxide) in the MOS transistors. A first polysilicon layer 14 of a thickness of less than 150 nm is deposited over the entire area and is rendered n-conducting by phosphorus diffusion. The polysilicon layer 14 doped with phosphorus and the underlying fourth insulating layer 13 are structured by means of photolithography in such a manner that the substrate surface is re-exposed in the emitter and collector zones of the bipolar transistors A. Following the removal of the photo-resist mask, a second polysilicon layer 15 of a thickness of the order of 150 to 350 nm is applied and together with the underlying layer 14 is structured by means of a photo-resist technique in such a manner that the gate electrodes G of the MOS transistors B, C and the emitter contact terminal of the bipolar transistors A are formed. The phosphorus implantation for the production of the source/drain connection zones 24 to produce a lightly doped or "soft" pn-junction on the drain of the n-channel MOS transistors B is then carried out. The mask used for structuring the first and second polysilicon layer 14, 15 is then removed.

FIG. 4 shows the condition following the photolithography, when the arsenic ion implantation required for the production of the source/drain zones 16 of the n-channel MOS transistors B and for doping the emitter and collector zones of the bipolar transistors A is carried out in a known manner. Similarly, following the corresponding photo-resist masking, the production of the source/drain zones 17 of the n-channel MOS transistors C is subsequently carried out by means of boron implantation. During the diffusion of the ions in the source/drain zones 16, 17, at, for example, 950° C., the dopant is simultaneously driven out of the structures forming the emitters and base terminal zones, and the base and emitter zones 22, 23 are produced. In order to avoid a gate/drain overlap in the MOS transistors B, C, an insulation oxide 18 can be produced on the sidewalls of the polysilicon layer structures 14, 15 prior to the source/drain implantations. Thus, the sidewall insulation 11 of the layer structures 8, 9 is reinforced. All active zones of the transistors A, B, C, with the exception of the base terminal formed by the structure 8, can be contacted by a selective deposition of a metal or metal silicide. In FIG. 4, the silicide layer structure is identified at reference numeral 19. Contactmaking can also be effected by a self-aligning formation of a silicide on the exposed silicon surfaces.

The production of an intermediate layer 20 serving as an insulation oxide, the opening of the contact apertures to the p⁺-and n³⁰ -conducting layers 16, 17 and to the terminals of the base, emitter and collector zone of the bipolar transistors A and of the gate electrodes G, the terminals consisting of the structures 8, 15, and 19 is carried out in the usual manner as well as the implantation of the metallic electrodes 21.

The embodiment illustrated in FIG. 4 is suitable for the integration of bipolar transistors and dynamic CMOS memory cells D on the same substrate because the production of the MOS capacitance only requires the additional process steps for the formation of the electrode 7 of the storage capacitor which is arranged in the substrate. However, it is also highly advantageous for the integration of the bipolar and CMOS transistors alone, without capacitances. An important advantage of the described process consists in that not only the emitter zone but also the collector zone is produced so as to be self-aligning to the first conductive layer. Thus, the minimal distance between emitter and collector is represented by the structure width of the layer in addition to the width of spacer oxide 1 less the diffused portion and can therefore clearly amount to less than 2 microns. Reference numeral 30 indicates the section of the layer 6 which prevents the boron atoms from being diffused from the section of the layer 8 which is adjacent to the collector zone K.

Figure 5:
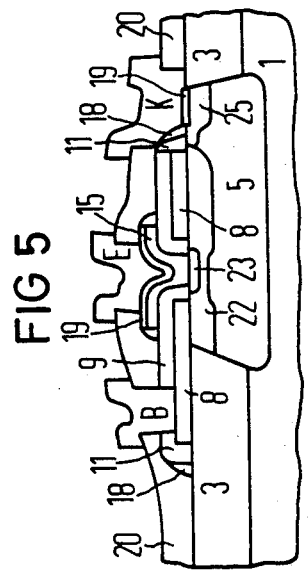

In FIG. 5, there is illustrated a modified form of the invention which involves omitting the process steps described in FIGS. 1 to 4 and corresponding to the process steps (e) to (h) previously set forth in this Specification. A considerable simplification of the process can thus be achieved. There are, however, disadvantages as follows:

(a) When structuring the first conductive layer 8, 9 etching is carried out to the later gate regions G of the MOS transistors B, C.

(b) The base collector capacity of the bipolar transistor A increases so that the transit frequency of the bipolar transistors A is slightly lower than in the embodiment described in FIGS. 1 to 4.

A combination of these two embodiments is also feasible, namely, retaining process steps (e) to (h) but completely removing the first thin insulating layer 6 in the region of the bipolar transistors A.

Figure 6:
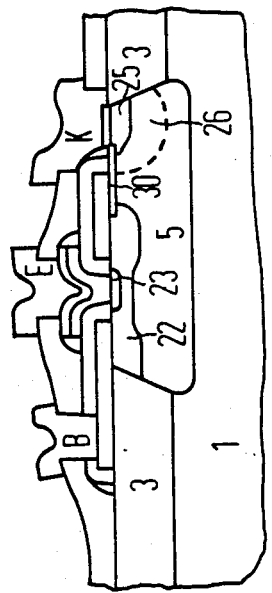
FIGS. 5 to 7 illustrate sectional views of bipolar transistor structures in accordance with the invention, FIG. 5 illustrating an arrangement wherein the process steps for producing the storage capacitance have been omitted, FIG. 6 illustrating an arrangement with an additional diffusion of phosphorus into the collector zones and FIG. 7 illustrating a similar arrangement, wherein the collector contact region is additionally widened and used as a phosphorus diffusion source.

Referring to FIG. 6, there is illustrated the condition wherein by means of additional photo-techniques relative to the embodiment described in FIGS. 1 to 4, the later collector zone is directly exposed, this step being referred to as process step (r) in the previously recited sequence. Thus, the doping of the first polysilicon layer 14 with phosphorus results in a phosphorus diffusion zone 26 into the collector zones 25 and consequently in a reduction of the collector resistance.

For the sake of simplicity, only the most important references have been identified in FIG. 6 and in the following Figures.

Figure 7:
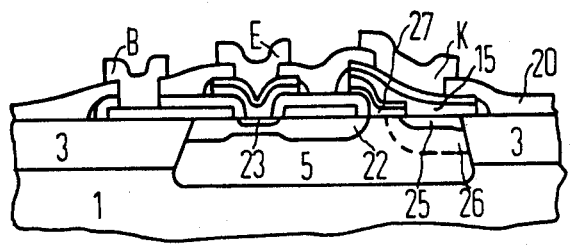

Referring to FIG. 7, any lateral distance between the collector zone K and the p⁺-diffusion zone 22 of the base terminal B can, for example, be adjusted by the following layout measures in connection with the embodiment illustrated in FIG. 5. Structuring of the first polysilicon layer and the fourth insulating layer with a photo-resist mask, the substrate is exposed in the emitter and collector zones of the bipolar transistors, and structuring the first and second polysilicon layers to form gate electrodes in the MOS transistors and emitter contacts in the bipolar transistors is carried out such that a strip 27 of the double layer 14, 15 which is to be etched is retained between the base terminal diffusion and the collector and second polysilicon layer 15 is retained above the collector. Thus, the remaining first polysilicon layer 14 acts as a phosphorus diffusion source into the collector zone K. However, this procedure has the disadvantage that the distance between emitter E and collector K is greater by at least one adjusting tolerance than in the case of the process which has heretofore been described.

Figure 8:
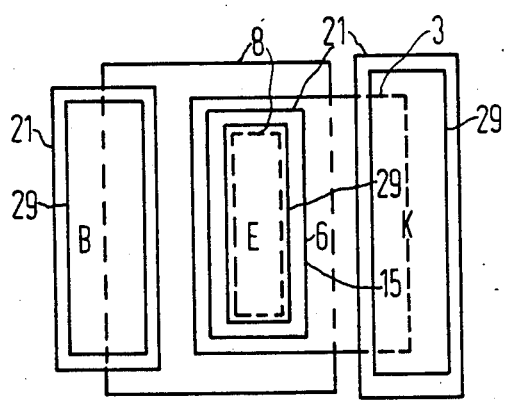

There are a few fundamentally different possibilities for the layout of the bipolar transistors A. FIG. 8 illustrates a bipolar transistor whose production is described in detail in FIGS. 1 to 4 with reference to the exemplary embodiment. This transistor has only one collector terminal K and is therefore slower than the other embodiment illustrated in FIGS. 9 and 10 in relation to the switching speed.

Figure 9:
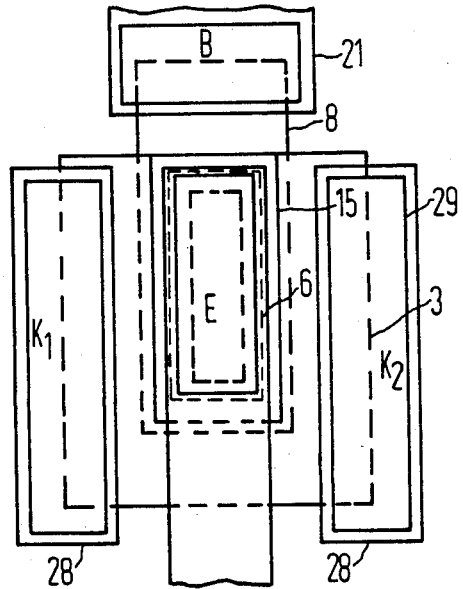

FIG. 9 illustrates a bipolar transistor having a U-shaped collector terminal wherein the two sidewalls $K_1$ and $K_2$ of the U-shaped collector are metallized. The connection between them is only established by means of the collector diffusion zone 28. Reference numeral 29 denotes the boundary of the etching of the contact apertures. Otherwise, the same reference numerals apply as in the remaining Figures.

FIG. 10 illustrates a bipolar transistor having two strip-shaped collectors $K_1'$ and $K_2'$ with a metallic connection. However, this layout is only possible if the first conducting layer 8 can be used for the local wiring of the base terminal. In this case, a particularly small collector substrate capacity is obtained despite the use of a double collector terminal. This construction is therefore suitable for extremely high switching speeds.

It should be evident that various modifications can be made to the described embodiments without departing from the scope of the present invention.

We claim as our invention:

1. In a process for the simultaneous production of self-aligned bipolar transistors and complementary MOS transistors on a common p-doped silicon substrate wherein n-doped regions are produced in said p-doped substrate and insulated npn-bipolar transistors are formed into said n-doped regions, said n-regions forming the collectors of said bipolar transistors, the sequence of steps in the following order:
   (a) applying a double layer of silicon oxide and silicon nitride onto said p-doped substrate, and structuring said silicon nitride layer for subsequent local oxidation,
   (b) locally oxidizing said substrate to form field oxide zones for separation of the active transistor regions to be formed, using said silicon nitride layer as a mask,
   (c) implanting n- and p-doping ions in said substrate with diffusion,
   (d) removing the nitride/oxide mask,
   (e) applying a first insulating layer of a thickness not exceeding 50 nm over the full area of said substrate to serve as a protective layer for the later formed gate zones during etching, serve as a dielectric for storage capacitors formed in said substrate, and prevent diffusion of boron from a subsequently applied p-conducting layer in portions of said bipolar transistors which are adjacent to the later formed collector zones,
   (f) removing said first insulating layer in the portions other than those to form the collector zones of the bipolar transistors, utilizing a photo-resist mask,
   (g) removing said photo-resist mask,
   (h) implanting a dopant to form the electrodes of said storage capacitor utilizing a photo-resist mask,
   (i) depositing a p-conducting layer of polysilicon, a refractory metal silicide or a double layer of polysilicon and refractory metal silicide over the full area of said substrate,
   (j) applying a second insulating layer over said full area,
   (k) dry etching said p-conducting layer and said second insulating layer by a photo-resist process to form vertical sidewalls, said etching extending down to said substrate for defining the base zones of the bipolar transistors and the storage capacitor zones, implanting channel zones in said MOS transistors,
   (l) implanting boron by a photo-resist process to produce active base zones,
   (n) depositing a third insulating layer over the edges of the structures of the p-conducting layer and said second insulating layer,
   (o) anisotropically etching the resulting structure to produce lateral insulating pieces from said third insulating layer on the sidewalls of said p-conducting layer and to expose the silicon substrate in the active zones of the MOS transistors and in the emitter and collector zones of the bipolar transistors,
   (p) applying a fourth insulating layer serving as a gate dielectric for the MOS transistors,
   (q) depositing a first undoped polysilicon layer over the full surface area,
   (r) structuring said first polysilicon layer and said fourth insulating layer with a photo-resist mask such that the substrate is exposed in the emitter and collector zones of the bipolar transistors,
   (s) removing the photo-resist mask of step (r),
   (t) depositing a second polysilicon layer over the resulting structure,
   (u) structuring said first and second polysilicon layers to form gate electrodes in said MOS transistors and emitter contacts in said bipolar transistors,
   (v) implanting phosphorus ions in the resulting structure to provide source/drain connection regions in the n-channel MOS transistors,
   (w) implanting arsenic ions in the resulting structures to produce source/drain zones in the n-channel transistors and doping the emitter and collector zones of the bipolar transistors,
   (x) implanting boron ions to produce source/drain zones in the p-channel transistors,
   (y) subjecting the resulting structure to a high temperature treatment on the order of 900° C. to diffuse arsenic into the source/drain zones of the n-channel transistors and into the emitter and collector zones, to diffuse boron into the source/drain zones of the p-channel transistors and into the base contact zones, and
   (z) forming electrical contacts to the p+- and n+-conducting terminals of the active transistor regions.

2. A process according to claim 1 wherein between the steps (v) and (w), the sidewalls of the gate electrodes of the MOS transistors of the collector contact and the emitter contact as well as the flanks of the p+-conducting layer structure which are covered with the fourth insulating layer are provided with an additional SiO$_2$ layer.

3. A process according to claim 1 wherein after process step (x) an intermediate layer consisting of an insulating oxide is produced.

4. A process as claimed in claim 1 wherein prior to forming the electrical contacts in accordance with process step (z), the contacts of all active zones of the transistors with the exception of the base terminal zone of the bipolar transistor are provided with a layer of metal silicide or a metal which forms a silicide.

5. A process as claimed in claim 1, wherein prior to process step (b), channel-stopper zones are produced by boron ion implantation below the field oxide zones.

6. A process as claimed in claim 1 wherein the doping of the p-conducting layer 8 is carried out during deposition as specified in process step (i).

7. A process as claimed in claim 1 wherein the doping of the p-conducting layer provided in process step (i) is accomplished by a subsequent ion implantation.

8. A process according to claim 1 wherein the thickness of said first polysilicon layer is adjusted to less than 150 nm and the thickness of the second polysilicon layer is in the range from 100 to 350 nm.

9. A process according to claim 1 wherein said first polysilicon layer is rendered n-conductive by a subsequent phosphorus diffusion.

10. A process according to claim 1 wherein said insulating layers consist of SiO$_2$ layers.

11. A process according to claim 1 wherein said insulating layers which serve as sidewall insulation are formed by thermal deposition of SiO$_2$ produced from decomposition of tetraethylorthosilicate.

12. In a process for the simultaneous production of self-aligned bipolar transistors and complementary MOS transistors on a common p-doped silicon substrate wherein n-doped regions are produced in said p-doped substrate and insulated npn-bipolar transistors are formed into said n-doped regions, said n-doped regions forming the collectors of said bipolar transistors, the sequence of steps in the following order:

applying a double layer of silicon oxide and silicon nitride onto said p-doped substrate, and structuring said silicon nitride layer for subsequent local oxidation, locally oxidizing said substrate to form field oxide zones for separation of the active transistor regions to be formed, using said silicon nitride layer as a mask, implanting n- and p-doping ions in said substrate with diffusion, removing the nitride/oxide mask, depositing a p-conducting layer of polysilicon, a refractory metal silicide or a double layer of polysilicon and refractory metal silicide over the full area of said substrate, applying an insulating layer over said full area, dry etching said p-conducting layer and said insulating layer by a photo-resist process to form vertical sidewalls, said etching extending down to said substrate for defining the base zones of the bipolar transistors and the storage capacitor zones, implanting channel zones in said MOS transistors, implanting boron by a photo-resist process to produce active base zones, depositing a second insulating layer over the edges of the structures of the p-conducting layer and said insulating layer, anisotropically etching the resulting structure to produce lateral insulating pieces from said second insulating layer on the sidewalls of said p-conducting layer and to expose the silicon substrate in the active zones of the MOS transistors and in the emitter and collector zones of the bipolar transistors, applying a third insulating layer serving as a gate dielectric for the MOS transistors, depositing a first undoped polysilicon layer over the full surface area, structuring said first polysilicon layer and said third insulating layer with a photo-resist mask such that the substrate is exposed in the emitter and collector zones of the bipolar transistors, removing the photo-resist mask, depositing a second polysilicon layer over the resulting structure, structuring said first and second polysilicon layers to form gate electrodes in said MOS transistors and emitter contacts in said bipolar transistors, implanting phosphorus ions in the resulting structure to provide source/drain connection regions in the n-channel MOS transistors, implanting arsenic ions in the resulting structure to produce source/drain zones in the n-channel transistors and doping the emitter and collector zones of the bipolar transistors, implanting boron ions to produce source/drain zones in the p-channel transistors, subjecting the resulting structure to a high temperature treatment on the order of 900° C. to diffuse arsenic into the source/drain zones of the n-channel transistors and into emitter and collector zones, to diffuse boron into the source/drain zones of the p-channel transistors and into the base contact zones, and forming electrical contacts to the p+- and n$^{30}$-conducting terminals of the active transistor regions.

13. A process as claimed in claim 1 which includes the step of exposing the collector zone by etching said first polysilicon layer and said fourth insulating layer.

14. A process according to claim 1 wherein the structuring of step (u) is carried out such that a strip of said first and second polysilicon layers which is to be etched and the entire second polysilicon layer above the collector are retained between the base terminal diffusion zone and the collector.

15. A process according to claim 1 in which, following process step (e), a polycrystalline silicon layer having a thickness of 100 nm is deposited to protect said first insulating layer and is structured together with said first insulating layer.

* * * * *